(12) United States Patent
Ehrne et al.

(10) Patent No.: US 12,241,556 B2
(45) Date of Patent: Mar. 4, 2025

(54) VACUUM VALVE FOR PROVIDING A SYMMETRICAL FLUID FLOW

(71) Applicant: VAT Holding AG, Haag (CH)

(72) Inventors: Florian Ehrne, Frümsen (CH); Martin Netzer, Bludenz (AT); Hanspeter Frehner, Sevelen (CH)

(73) Assignee: VAT HOLDING AG, Haag (CH)

( * ) Notice: Subject to any disclaimer, the term of this patent is extended or adjusted under 35 U.S.C. 154(b) by 94 days.

(21) Appl. No.: 17/182,999

(22) Filed: Feb. 23, 2021

(65) Prior Publication Data

US 2021/0278000 A1    Sep. 9, 2021

(30) Foreign Application Priority Data

Feb. 24, 2020    (DE) .................... 10 2020 001 179.9

(51) Int. Cl.
| | |
|---|---|
| *F16K 11/22* | (2006.01) |
| *F16K 1/20* | (2006.01) |
| *F16K 1/42* | (2006.01) |
| F16K 3/02 | (2006.01) |
| H01L 21/67 | (2006.01) |

(52) U.S. Cl.
CPC ............ *F16K 11/22* (2013.01); *F16K 1/2021* (2013.01); *F16K 1/42* (2013.01); *F16K 3/0227* (2013.01); *H01L 21/67017* (2013.01)

(58) Field of Classification Search
CPC .......... F16K 11/10; F16K 11/20; F16K 11/22; F16K 11/24; F16K 11/205; F16K 11/207; F16K 1/165; F16K 1/2021; F16K 1/223; F16K 1/44; F16K 1/52; F16K 3/0227;
(Continued)

(56) References Cited

U.S. PATENT DOCUMENTS

| | | | | |
|---|---|---|---|---|
| 3,746,041 A | * | 7/1973 | Friedland | ................ F16K 11/20 |
| | | | | 251/282 |
| 3,942,553 A | * | 3/1976 | Gallatin | .................. F16K 11/24 |
| | | | | 251/124 |

(Continued)

FOREIGN PATENT DOCUMENTS

| | | |
|---|---|---|
| CN | 105276247 A | 1/2016 |
| CN | 107504249 A | 12/2017 |

(Continued)

*Primary Examiner* — Kenneth Rinehart
*Assistant Examiner* — Jonathan J Waddy
(74) *Attorney, Agent, or Firm* — Muncy, Geissler, Olds & Lowe, P.C.

(57) ABSTRACT

Disclosed is a regulating vacuum valve having a first valve seat having a first valve opening defining a first opening axis and a first sealing surface surrounding the first valve opening, and a first valve disk having a first contact surface corresponding to the first sealing surface. The valve includes a drive unit coupled to the first valve disk to adjust at least between an open position to a closed position. The regulating vacuum valve has at least one second valve seat, having a second valve opening with a second sealing surface. In addition, a second valve disk having a second contact surface corresponding to the second sealing surface is provided. An overall valve opening of the regulating vacuum valve is formed by the first valve opening as a first valve partial opening and the second valve opening as a second valve partial opening.

14 Claims, 5 Drawing Sheets

(58) Field of Classification Search
CPC .... F16K 27/003; F16K 27/0263; F16K 31/04; F16K 31/047; F16K 51/02
USPC .......... 137/861; 251/599.01, 599.05, 599.06, 251/599.07, 601.01, 601.12, 601.14, 251/601.15, 602
See application file for complete search history.

(56) References Cited

U.S. PATENT DOCUMENTS

| | | | | |
|---|---|---|---|---|
| 4,148,340 | A | * | 4/1979 | Hutton .................. G05D 7/0652 137/599.07 |
| 4,170,245 | A | * | 10/1979 | Haley .................. G05D 7/0635 137/599.05 |
| 5,123,445 | A | * | 6/1992 | Chung-Shan ........... F16K 11/22 251/83 |
| 5,906,223 | A | | 5/1999 | Pinkham |
| 6,056,266 | A | | 5/2000 | Blecha |
| 6,089,537 | A | | 7/2000 | Olmsted |
| 6,112,767 | A | * | 9/2000 | Pinkham ............... F16K 27/003 137/599.11 |
| 6,416,037 | B1 | | 7/2002 | Geiser |
| 6,629,682 | B2 | | 10/2003 | Duelli |
| 6,994,311 | B2 | | 2/2006 | Duelli et al. |
| 2002/0185185 | A1 | | 12/2002 | Yamaji et al. |
| 2006/0196422 | A1 | | 9/2006 | Hiroki |
| 2010/0176323 | A1 | * | 7/2010 | Nguyen ................ F16K 27/029 137/625 |
| 2011/0186762 | A1 | | 8/2011 | Geiser |
| 2017/0356569 | A1 | | 12/2017 | Netzer et al. |
| 2022/0390028 | A1 | * | 12/2022 | Cole ....................... F16K 11/22 |

FOREIGN PATENT DOCUMENTS

| | | |
|---|---|---|
| CN | 109084052 A | 12/2018 |
| DE | 60210702 T2 | 11/2006 |
| EP | 1416204 A1 | 5/2004 |
| GB | 1080242 A | 8/1967 |
| JP | H03-107573 U | 11/1991 |

* cited by examiner

VACUUM VALVE FOR PROVIDING A SYMMETRICAL FLUID FLOW

The present application claims priority to German Patent application 10 2020 001 179.9 filed Feb. 24, 2020, which is herein incorporated by reference in its entirety.

The invention relates to a regulating vacuum valve having a plurality of valve disks and a corresponding plurality of valve partial openings.

In general, vacuum valves for regulating a volumetric or mass flow and for essentially gas-tight closure of a flow path leading through an opening formed in a valve housing are known in various embodiments from the prior art and are used in particular in vacuum chamber systems in the field of IC, semiconductor or substrate manufacturing, which must take place in a protected atmosphere preferably without the presence of contaminating particles.

Such vacuum chamber systems comprise in particular at least one evacuatable vacuum chamber, which is provided for receiving semiconductor elements or substrates to be processed or produced, and which has at least one vacuum chamber opening through which the semiconductor elements or other substrates can be guided into and out of the vacuum chamber, and at least one vacuum pump for evacuating the vacuum chamber. For example, in a production plant for semiconductor wafers or liquid crystal substrates, the highly sensitive semiconductor or liquid crystal elements pass sequentially through several process vacuum chambers in which the parts located within the process vacuum chambers are each processed by means of a processing device. Both during the processing process within the process vacuum chambers and during the transport from chamber to chamber, the highly sensitive semiconductor elements or substrates must always be in a protected atmosphere-especially in an airless environment.

For this purpose, peripheral valves are used to open and close a gas inlet or outlet and transfer valves are used to open and close the transfer openings of the vacuum chambers for inserting and removing the parts.

The vacuum valves through which semiconductor parts pass are referred to as vacuum transfer valves because of the field of application described and the associated dimensions, as rectangular valves because of their mostly rectangular opening cross-section, and as slide valves, rectangular slide valves or transfer slide valves because of their usual mode of operation.

Peripheral valves, on the other hand, are used in particular to control or regulate the flow of gas between a vacuum chamber and a vacuum pump or a further vacuum chamber. Peripheral valves are located, for example, within a pipe system between a process vacuum chamber or a transfer chamber and a vacuum pump, the atmosphere or a further process vacuum chamber. The opening cross-section of such valves, also called pump valves, is usually smaller than that of a vacuum transfer valve. Since, depending on the application, peripheral valves are used not only to fully open and close an opening, but also to control or regulate a flow rate by continuously adjusting the opening cross-section between a fully open position and a gas-tight closed position, they are also referred to as regulating valves. One possible peripheral valve for controlling or regulating the gas flow is the pendulum valve.

In a typical pendulum valve, such as the one known from U.S. Pat. No. 6,089,537 (Olmsted), the first step is to rotate a normally round valve disk, via an opening that is usually also round, from a position that releases the opening to an intermediate position that covers the opening. In the case of a slide valve, as described for example in U.S. Pat. No. 6,416,037 (Geiser) or U.S. Pat. No. 6,056,266 (Blecha), the valve disk, as well as the opening, is usually rectangular and in this first step is pushed linearly from a position releasing the opening into an intermediate position covering the opening. In this intermediate position, the valve disk of the pendulum or slide valve is located at a distance from the valve seat surrounding the opening. In a second step, the distance between the valve disk and the valve seat is reduced so that the valve disk and the valve seat are pressed evenly against each other and the opening is closed essentially gas-tight. This second movement preferably occurs in a direction substantially perpendicular to the valve seat. The sealing can, for example, take place either via a sealing ring arranged on the closing side of the valve disk, which is pressed onto the valve seat surrounding the opening or via a sealing ring on the valve seat, against which the closing side of the valve disk is pressed. Due to the two-step closing process, the sealing ring between the valve disk and the valve seat is subjected to hardly any shear forces that would destroy the sealing ring, as the movement of the valve disk in the second step takes place essentially in a straight line perpendicular to the valve seat.

Various sealing devices are known from the prior art, for example from U.S. Pat. No. 6,629,682 B2 (Duelli). A suitable material for sealing rings and seals in vacuum valves is, for example, fluororubber, also known as FKM, in particular the fluoroelastomer known under the trade name "Viton", and perfluororubber, FFKM for short.

The multi-stage movement described, in which the closure member is first pushed transversely over the opening without contact between the seal and the valve seat, and the closure member is then pressed essentially vertically onto the valve seat, offers not only the advantage that the seal is pressed almost exclusively vertically without any transverse or longitudinal loading of the seal (particle avoidance), but also the possibility of regulating the flow rate of a medium (e.g. process gas) through the valve opening.

Since the above-mentioned valves are used, among other things, in the manufacture of highly sensitive semiconductor elements, the particle generation caused in particular by the actuation of the valve and by the mechanical load on the valve closure member and the number of free particles in the valve chamber must be kept as low as possible, as already mentioned. Particle generation is primarily a consequence of friction, for example through metal-to-metal contact or through abrasion.

As described above, regulating vacuum valves are used to set a defined process environment in a process chamber. The regulation is typically based on a pressure signal, which provides information about the internal chamber pressure, and based on a target value, i.e. a target pressure, which is to be achieved by means of the regulation. The position of a valve closure (valve disk) is then varied within the framework of the regulation in such a way that the target pressure is reached within a certain period of time.

The above embodiments have in common that, especially in the case of regulation, a regulating curve (volumetric flow over unit time) resulting from one of these constructions typically occurs with a disadvantageous curve progression. In particular, the curve in the transition from an almost closed valve state to a fully closed valve state shows a clearly inhomogeneous curve progression due to a "snapping effect" occurring in the process. A flow through the opening is abruptly interrupted in this case. This makes fine regulation at very low pressures very difficult or impossible.

Another critical factor in connection with semiconductor manufacturing is the use and handling of process gas required for individual processing steps. The regulating valve typically also assumes the function of providing a defined gas concentration, i.e. regulating it by means of a variable gas outflow through the valve. The process gas is usually supplied at a side of the process chamber opposite the evacuation opening.

In addition to the gas concentration and the atmospheric pressure, the most homogeneous possible distribution of the process gas is also advantageous here, at least in the area of the substrate to be processed. A flow of the gas through the process chamber that is as symmetrical as possible, i.e. both during gas addition and during evacuation, can be helpful in this regard.

U.S. Pat. No. 6,994,311 B2 discloses a regulating vacuum valve with the aim of producing a symmetrical flow through an opening in an open valve position. The valve disk is suspended centrally on a guide (valve rod) and can be guided axially so that a volumetric flow through the opening can be adjusted as a function of the distance between the valve disk and the valve seat.

However, a disadvantage of this solution is still that a mechanical connection into the center of the valve opening must be present to provide guidance for the valve disk. This mechanical connection breaks up the symmetry of the flow, at least in part, and leads to turbulence at the connecting elements.

The invention is thus based on the object of providing a regulating vacuum valve which, on the one hand, provides precise regulation or adjustment of the valve opening and thus of a flow through the opening and, on the other hand, provides a homogeneous flow through the valve opening.

In particular, it is the object of the invention to provide the above improvements with comparatively short valve closure adjustment times.

This object is solved by the realization of the features of the independent claims. Features which further develop the invention in an alternative or advantageous manner are to be taken from the dependent claims.

The invention relates to a structure of a vacuum valve, in particular a regulating vacuum valve, which provides an improved flow rate and outflow of process fluid from a process volume with respect to the homogeneity of the flow behavior. At the same time, an adjustment time for a change from an open state to a closed state (or vice versa) can be significantly improved, i.e. reduced.

The advantages and improvements mentioned are provided by subdividing a single valve opening known in the prior art into a plurality of valve partial openings in a vacuum valve. The partial openings are arranged symmetrically around a central valve axis. Each valve partial opening is provided in each case by a valve seat and surrounded by a sealing surface. The sum of the areas of the several valve partial openings results in the area of the overall valve opening.

The overall valve opening cross-section is the sum of the opening cross-sections of the plurality of valve partial openings, wherein the opening cross-section depends on the respective opening state of the valve partial openings, i.e. on the flow area released by the respective valve closure.

By dividing the valve opening and the associated arrangement likewise of several valve closures (valve disks), a structure can be provided in which, in an open position, i.e. when a maximum flow (volumetric flow) is provided, the valve closures no longer cover the respective valve opening, or at least not to the greatest possible extent. In other words, the valve disks can be adjusted in such a way that the valve openings are substantially, in particular completely, uncovered. In the open position, the valve closures may be completely or substantially completely removed from a flow channel (flow passage) connecting a first port and a second port of the regulating vacuum valve.

By removing the valve closures from the flow channel, an arrangement of any mechanical elements required to couple the valve closures can be avoided within the flow channel. Thus, no moving or mechanical parts are present in the flow channel in the open position. Only a structurally fixed arrangement to define the valve seats is present therein. However, this fixed structure can advantageously be designed so that it also has symmetrical shape and dimension about the central axis. Such a design can provide a highly symmetrical flow through the valve in any opening condition.

The vacuum valve according to the invention has a drive unit, comprising at least one drive component, in particular a number of drive components corresponding to a number of valve closures. A drive component can be designed as a motor, for example.

The invention thus relates to a regulating vacuum valve for regulating a volumetric or mass flow and for interrupting a flow path in a gas-tight manner. The regulating vacuum valve has a first valve seat, which in turn has a first valve opening defining a first opening axis and a first sealing surface surrounding the first valve opening. In addition, a first valve disk with a first contact surface corresponding to the first sealing surface is provided.

The regulating vacuum valve further has a drive unit which is designed and coupled to the first valve disk in such a way that this valve disk can be adjusted at least from an open position, in which the first valve disk and the first valve seat are present without contact relative to one another, into a closed position, in which there is an axially sealing contact between the first sealing surface and the first contact surface via an intermediate sealing element 19 and the first valve opening is thus closed in a gas-tight manner, and back (e.g. motorized).

According to the invention, the regulating vacuum valve comprises at least a second valve seat having a second valve opening defining a second opening axis and a second sealing surface surrounding the second valve opening. Furthermore, the valve comprises a second valve disk having a second contact surface corresponding to the second sealing surface. An overall valve opening of the regulating vacuum valve is thereby formed the by first valve opening as a first valve partial opening and the second valve opening as a second valve partial opening.

The provision of at least two groups, each comprising at least one valve seat and one valve closure, allows a symmetrical arrangement around a center of the vacuum valve, wherein an overlapping of the valve opening by the valve closures in the open position can be at least largely avoided. Thus, on the one hand, a symmetrical volumetric flow through the valve and, on the other hand, a comparatively fast actuation (i.e. fast adjustment of the valve closures due to the comparatively small individual masses of the valve closures) with the possibility of a very flexible volumetric flow regulation, i.e. also the achievement of a comparatively large overall opening cross-section from a closed position (and vice versa) in a short time, can be provided.

In one embodiment, the regulating vacuum valve has a third valve seat, which has a third valve opening defining a third opening axis and a third sealing surface surrounding the third valve opening, and a third valve disk with a third contact surface corresponding to the third sealing surface. The overall valve opening is then additionally formed by the third valve opening as a third valve partial opening.

By arranging a third combination or further combinations of valve seat and valve disk, the symmetry of the valve opening about a central axis of the valve can be obtained and thus the symmetry of the volumetric flow (concentric) through the valve can be further increased.

In particular, the drive unit can be coupled to the second valve disk, in particular to the third valve disk, in such a way that the coupled valve disks can be adjusted at least from a respective open position, in which the respective valve disk and the respective valve seat are present without contact relative to one another, into a closed position, in which there is an axially sealing contact between the respective sealing surface and the respective contact surface via a respective sealing element located therebetween and the respective valve partial opening is thereby closed in a gas-tight manner, and back again.

In one embodiment, the regulating vacuum valve can have a coupling arrangement, which coupling arrangement provides a mechanical coupling of the first valve disk with the second valve disk, and in particular with the third valve disk, and is connected to the drive unit in such a way that the respective valve disks can be adjusted together by means of the drive unit. The coupling arrangement can be implemented, for example, with a shaft, joints (e.g. universal joints), bearings and/or gear ratios.

For example, a simultaneous adjustment of all coupled valve disks can be provided by means of a mechanical solution. In this way, a homogeneous and symmetrical fluid flow through the valve can be achieved in particular by providing the same opening cross-section for all openings already when the valve partial opening is opened for the first time and the flow through all openings is and remains the same with regard to the volumetric or mass flow.

According to a further embodiment, the drive unit has at least a first and a second, in particular a third, drive component, in particular respective motors. The first drive component is coupled to the first valve disk and the second drive component is coupled to the second valve disk, in particular the third drive component is coupled to the third valve disk.

In contrast to the previous embodiment, in this variant each of the valve disks can be controlled and adjusted individually. This allows greater flexibility with regard to the adjustment of the flow behavior through the valve. For example, asymmetries of the volumetric flow caused by processing devices in the process chamber can be compensated. Such compensation can be implemented by providing different opening cross-sections for the individual valve partial openings.

In particular, the flow behavior within the chamber can be adjusted to compensate for an asymmetric flow caused, for example, by an arrangement in the chamber for processing a substrate (e.g., a chuck, a fixture, an electrode, etc.). The flow would be correspondingly inhomogeneous through the process chamber when using a conventional valve. By making the downstream flow adjustable using the valve of the invention, the downstream flow of the fluid can counteract the asymmetric flow through the chamber, ultimately resulting in an overall symmetric flow through the chamber. The flow through the valve can thereby be correspondingly asymmetrical (not centric, i.e. asymmetrical with respect to a central axis).

For example, different flow velocities are present on different (e.g. opposite) valve sides.

The regulating vacuum valve can in particular have a control unit, in particular a regulating unit, wherein the drive unit (and its drive components) can be controlled by means of a control signal provided by the control unit, in particular by means of a controlled variable. In particular, each drive component of the drive unit can be controlled individually by means of an (individual) control signal.

In one embodiment, the regulating vacuum valve may have a first port and a second port, wherein the first and second valve seats are arranged in a flow channel which (i.e. the flow channel) interconnects the first port and the second port and defines a flow path, in particular wherein the first and second valve disks are disposed at least substantially, in particular completely, outside the flow channel in the open position.

The two ports can be provided in particular for an arrangement of the regulating vacuum valve between a process or vacuum chamber and a vacuum pump. By selectively setting or regulating the opening state of the valve, a target pressure or a pressure curve in the chamber can be set or regulated by generating a vacuum on the part of the vacuum pump. The two ports thus define a flow channel, which can be completely or partially blocked by the valve closures.

In one embodiment, the first and second valve partial opening, in particular the third valve partial opening, can be arranged symmetrically about a central axis of the regulating vacuum valve, wherein the central axis extends through a valve center point, in particular forming a central axis of the flow channel. Due to its geometry, the valve can define a flow path for a fluid on the one hand and thus a restricted flow channel for the fluid on the other hand. The central axis lies in particular in the center of this channel and extends according to the extension of the channel.

At least one of the valve disks can be linearly adjustable along an adjustment axis. The valve closures can also all be designed to be linearly adjustable. A contact surface (sealing surface) of a closure can be circumferentially equidistant from a corresponding sealing surface of the valve seat at any time during the movement. A first sealing plane defined by the sealing surface can (always) be aligned parallel to a second sealing plane (contact plane) defined by the contact surface. The valve closure is moved parallel relative to the valve seat. Alternatively, the valve closures can be rotatably mounted.

In one embodiment, at least one of the valve disks may be in the form of a hinged valve closure rotatably mounted about an axis of rotation.

The drive unit and the at least one of the valve disks can in particular be designed and can interact, in particular coupled, in such a way that the at least one valve disk can be adjusted into a fine regulating position in which the at least one valve disk is inclined relative to the associated valve seat in such a defined way that a first sealing plane and a second sealing plane enclose a defined angle, wherein the associated sealing surface defines the first sealing plane and the associated contact surface defines the second sealing plane. The sealing element can be in full contact with the associated sealing surface or contact surface and only partially in contact with the other sealing surface or contact surface.

In the fine regulating position, therefore, a smaller proportion of the surface area of the seal is in contact or compression with the opposite sealing surface than in the closed position.

Such a specific relative inclined position between valve seat and valve closure and the adjustable opening range of the valve opening as a function of the inclination enable the advantageous pressure and flow regulation. Such regulations can typically be used, for example, when using process gas and the associated requirement to set a target pressure. Due to a continuous laminar flow of the medium through the opening that can be effected in this way, pressure fluctuations can be avoided and the target pressure can be reached more quickly. The still provided possibility of completely separating the valve disk from the valve seat (open position) also means that the flow opening can be selected to be very large.

A larger opening angle means a larger flow opening and thus the possibility of a flow of a larger volume per time unit. By reducing the opening angle, the flow can be reduced gradually and/or continuously until there is complete contact between the sealing surfaces or the seal of the valve seat and the valve disk and the partial opening is thus in a completely closed state (closed position).

With a valve according to the invention, the above-mentioned flows can be regulated advantageously, i.e. even at very low pressures and while providing and maintaining a substantially symmetrical and laminar flow.

In one embodiment, the drive unit and the at least one of the valve disks can be designed and coupled in such a way that when the at least one of the valve disks is moved from the open position to the closed position or from the closed position to the open position, the at least one valve disk assumes the fine regulating position before reaching the closed position or before reaching the open position. This can be realized, for example, by a corresponding activation or control of the drive unit, e.g. by a controlled tilting of the valve disk relative to the valve seat.

With respect to the orientation of the sealing surface of the valve seat, according to one embodiment, the first sealing surface (of the valve seat) can face in a direction parallel to the opening axis and extend orthogonally to the opening axis.

According to one embodiment according to the invention, the at least one of the valve disks is positioned in the fine regulating position in such a way that the second sealing plane defined by an extension of its contact surface is present obliquely to the opening axis.

In one embodiment, the first and second sealing planes enclose a defined angle α in the open position and in the fine regulating position, and the first and second sealing planes are aligned essentially parallel to each other in the closed position. During a movement from the fine regulating position to the closed position, the value of the angle α thus approaches ever closer to "zero" and finally becomes "zero".

It is understood that according to one embodiment not only one single fine regulating position can be set, but a second, several or a plurality of fine regulating positions of the valve disk can be set, in particular continuously. In this case, the angles $α_n$ enclosed by the first and second sealing planes are different in each case and the first and second sealing surfaces are only partially in contact in each case by means of the sealing element (seal). Thus, the plurality of fine regulating positions may each correspond to a different inclined position of valve disk with respect to the valve seat. In particular, each inclined position can be assigned to a respective fine regulating position during a continuous closing movement.

In particular, a defined flow behavior through the regulating vacuum valve, in particular through the at least two valve openings in their entirety, can be adjustable and/or regulatable, in particular wherein the flow behavior can be adjusted asymmetrically with respect to a central axis of the regulating vacuum valve. The central axis extends through a valve center point, in particular forming a central axis of the flow channel. In this way, at least partial compensation can be achieved for flow behavior that is initially asymmetrical due to asymmetries in the chamber.

In particular, the fine regulating positions can be set individually or continuously in a controlled manner and thus a particularly continuous regulation of the volumetric or mass flow of a medium through the valve opening can be provided. In particular, the flow can be maintained in a laminar manner. Such a regulation is provided in particular by a stepper motor or a servo motor of the drive unit, by which the rotation of the valve disk is provided.

According to one embodiment, the first valve seat and the second valve seat may be arranged in a common plane. Alternatively, the first valve seat and the second valve seat may be arranged at an angle relative to each other such that the plane defined by the first sealing surface and the plane defined by the second sealing Surface enclose a defined angle. For example, the valve seats may be oriented such that the defined sealing planes each comprise a side face of a virtual pyramid.

In one embodiment, the alignment may be such that the opening axis defined by the respective valve opening of a valve seat intersects the center of the respective valve partial opening and extends orthogonally to the respective sealing plane defined by the extension of the respective sealing surface, and the respective opening axes intersect, in particular intersect at a common point of intersection. The common point of intersection lies in particular on the central axis of the valve.

According to one embodiment, the drive unit has at least one motor and at least one guide component, in particular guide rod, which can be moved along a longitudinal axis under the control of the at least one motor, wherein the valve disk is movable with the guide component relative to the valve seat.

The position of the longitudinal axis is defined in particular by the extension of the guide component, which is designed or designated, for example, as a push rod or guide rod, and/or by the direction of linear motion provided by the drive unit.

The device according to the invention is described in more detail below by means of specific exemplary embodiments shown schematically in the drawings, purely by way of example, wherein further advantages of the invention are also discussed. The figures show detail:

FIGS. 1a-b show a first embodiment of a regulating vacuum valve according to the invention in a closed position and in an open position in cross-section;

FIGS. 2a-b show the first embodiment of a regulating vacuum valve according to the invention in an open position and in a closed position in a plan view;

FIG. 3 shows a second embodiment of a regulating vacuum valve according to the invention;

FIGS. 4a-b show a third embodiment of a regulating vacuum valve according to the invention in an open position and in a closed position in cross-section;

FIGS. 5a-b show the third embodiment of a regulating vacuum valve according to the invention in an open position and in a closed position in a plan view;

Figure 1A:
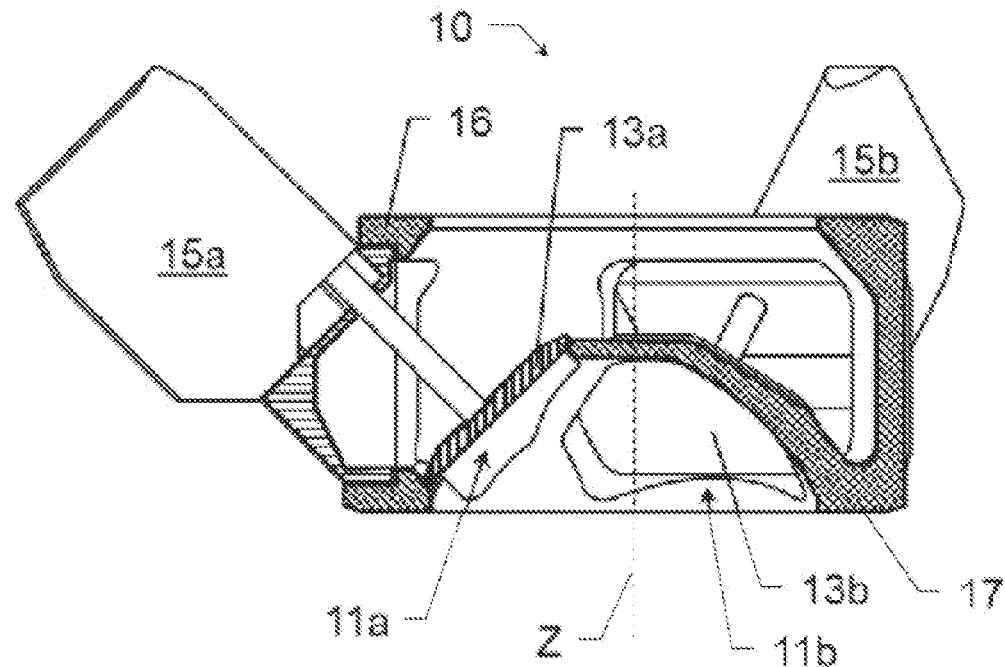
Figure 1B:
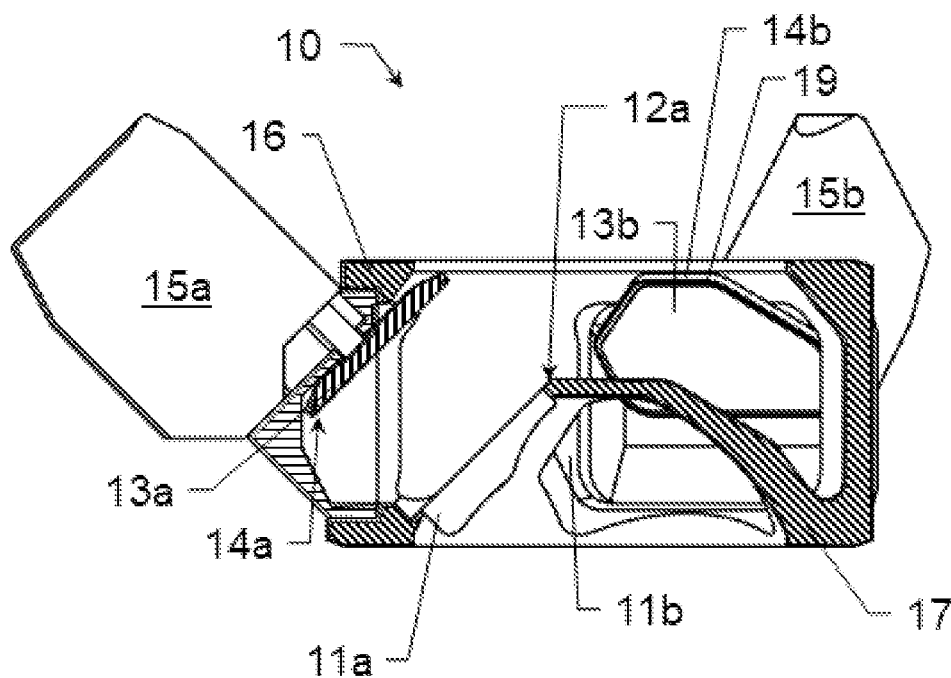
Figure 2A:
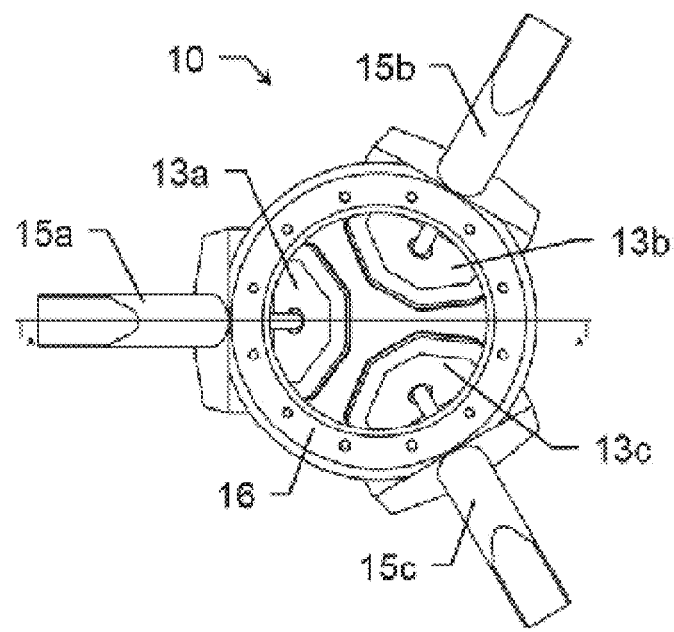
Figure 2B:
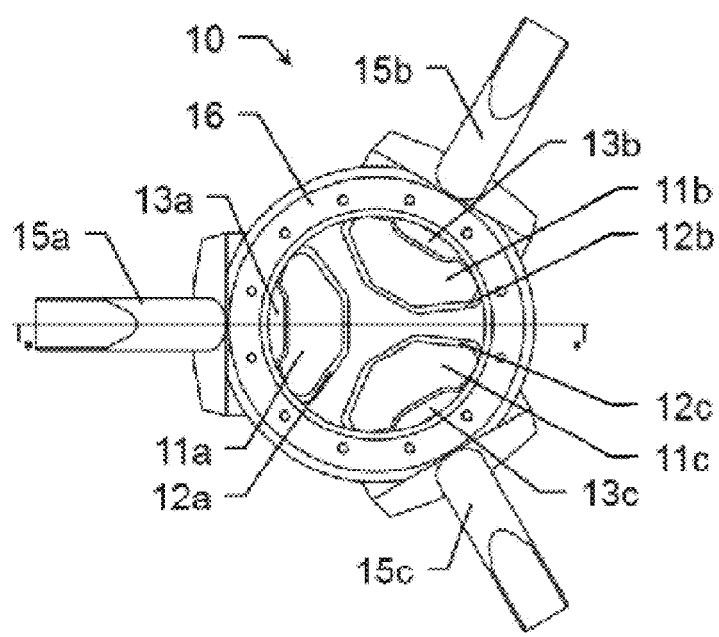

FIG. 1a shows a schematic cross-section of an embodiment of a regulating vacuum valve 10 according to the invention in a closed position. FIG. 2a shows the embodiment of the regulating vacuum valve 10 in a plan view, also in the closed position. FIGS. 1b and 2b show the embodiment of the regulating vacuum valve 10 correspondingly in the open position.

The regulating valve 10 has three valve partial openings, wherein only two of the three openings 11a, 11b are shown in the cross-sectional illustration. The arrangement of all three partial openings as well as associated valve disks and valve seats can be seen in FIGS. 2a and 2b.

In the following, reference will also be made in part to a first and second valve disk, valve seat and associated components as representative of the third valve partial opening. The design around the third valve partial opening is essentially analogous to the other two.

The valve partial openings 11a-11c are arranged symmetrically about a central axis Z of the valve 10. The central axis Z is defined by a flow center of the valve 10. The flow center in turn corresponds to a geometric center of a flow path or flow channel for a fluid provided jointly by the valve partial openings.

Accordingly, the regulating vacuum valve 10 has a first, a second and a third valve seat. Each of the three valve seats in turn has a valve partial opening 11a-11c, which are surrounded by respective sealing surfaces 12a-12c. Corresponding to the valve seats, a first valve disk 13a, a second valve disk 13b and a third valve disk 13c are provided. The valve disks 13a-13c are designed in such a way that their contact surfaces 14a-14c (disk-side sealing surfaces) correspond to the sealing surfaces 12a-12c of the valve seats. Accordingly, the contact surfaces each have essentially the same shape and spatial extent according to the respectively associated sealing surfaces.

Each valve disk 13a-13c has a sealing means, in particular a seal, e.g. in the form of an O-ring or vulcanized polymer, in particular fluoropolymer, on its contact surface 14a-14c. As an example, such a seal can be seen on contact surface 14b in FIG. 1b. According to alternative embodiments, the sealing means can be provided alternatively or additionally on the side of the sealing surfaces 12a-12c.

According to the number of valve disks, a corresponding number of drive components 15a-15c are provided according to this embodiment, which together form the drive unit of the valve 10. Each drive component 15a-15c is connected to a valve disk 13a-13c by means of a coupling rod.

The drive components 15a-15c are designed in such a way that linear adjustability of the valve disks 13a-13c is provided along respective axes defined by the extension of the coupling rods. The drives are designed, for example, as linear motors or stepper motors. The alignment of the valve disks 13a-13c or the contact surfaces 14a-14c is parallel to the alignment of the valve seats or the sealing surfaces 12a-12c both in the open and in the closed state.

In the embodiment shown, a motor 15a-15c is associated with each valve disk 13a-13c. In an alternative embodiment (not shown here), only one motor can be provided, which is connected to all valve disks by means of a coupling unit. The coupling unit may comprise, for example, joints, shafts and/or gear ratios, etc. An opening or closing of the valve can thus be effected by a simultaneous opening or closing of all valve partial openings.

The three valve seats are arranged at an angle relative to each other. Each sealing surface 12a-12c defines a sealing plane by its shape and extension.

In particular, the valve seats are aligned in such a way that the respective sealing planes enclose different side faces of a virtual, in particular regular or straight, pyramid with a polygonal base. In other words, each side face of the virtual pyramid with polygonal base lies in one of the sealing planes. In the embodiment shown, the base area of the pyramid is triangular.

Such an arrangement of the individual valve partial openings 11a-11c offers the advantage of a less complex mechanism for providing the open and closed state. A linear adjustment of the disks 13a-13c, which can be precisely controlled by means of the drive unit, in addition to the opening and closing of the openings 11a-11c, also enables the setting of a specific opening cross-section of both each individual valve partial opening 11a-11c and a resulting overall valve opening.

For example, by allowing a valve disk to gradually approach the associated valve seat, the opening cross-section of the relevant valve partial opening can be reduced step by step, in particular continuously.

Thus, the regulating vacuum valve 10 also provides the possibility to selectively adjust a fluid flow through the valve opening(s). If a certain internal pressure is to be provided in a process chamber, the regulating vacuum valve 10, which is then preferably connected to a vacuum pump on the one hand and to the process chamber on the other, can be used to set a certain quantity (mass or volume) of fluid that flows out per unit of time. For example, an internal pressure in the chamber determined by means of a pressure sensor can be used as a controlled variable. Alternatively, the opening cross-section can be set and varied in a controlled manner using a predetermined rule.

The regulating vacuum valve 10 further comprises a first port 16 and a second port 17. At least one of the ports may be formed as a flange. The valve seats are disposed in the flow path of a flow chamber connecting the first port 16 and the second port 17.

It should be noted that the invention does not extend solely to embodiments with three or more valve partial openings, valve seats and valve disks, but in particular also includes those solutions which each have two valve openings, valve seats and valve disks.

Figure 3:
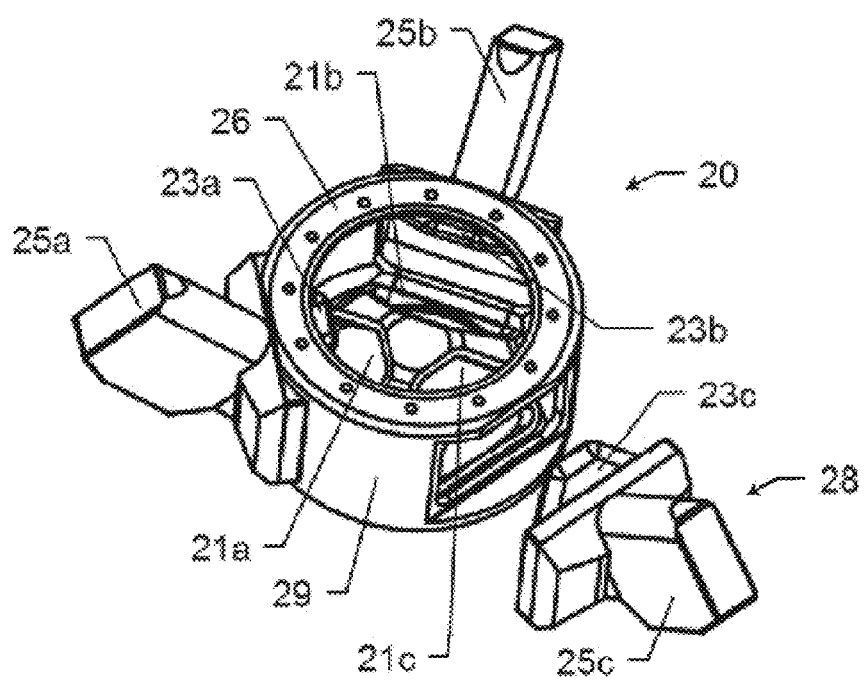

FIG. 3 shows another embodiment of the invention. The regulating vacuum valve 20 also has three valve seats and three corresponding valve disks 23a-23c, which are provided for adjusting a flow rate through the respective valve partial openings 21a-21c.

A first port 26 opposite the second port provides connectivity of the valve 20 to, in particular, a pipeline, a process chamber, or a vacuum pump.

Each valve disk 23a-23c is mechanically coupled to a respective drive component 25a-25c and can thus be adjusted along a respective linear adjustment axis. The functional principle-opening, interrupting and regulating a flow—is thus similar to that of the preceding embodiment.

Each valve disk 23a-23c forms a valve assembly with its respective associated drive component 25a-25c. Each valve assembly thus has—in addition to further fastening and sealing components-exactly one drive component and one valve disk. A valve assembly 28 consisting of valve closure 23c and motor 25c is referenced by way of example in FIG. 3. Analogous further two such assemblies are formed by the combination of the valve closure 23a with the motor 25a and by the combination of the valve closure 23b with the motor 25b.

As shown in FIG. 3, the regulating vacuum valve 20 is designed such that the valve assemblies are modularly interchangeable. The housing 29 of the valve 20, which housing 29 comprises the three valve seats, has three recesses circumferentially for this purpose. Each of the recesses is associated with one of the valve seats and, in particular, is arranged opposite this valve seat.

The recess and the valve assembly 28 are formed to be adapted to each other such that the assembly 28 is insertable into and connectable to the recess by means of the fastening means thereof. Such a fastening can take place, for example, by means of a screw connection or clamping. Preferably, a seal is provided between a contact surface running around the recess and the corresponding contact surface of the valve assembly 28.

The modular design allows comparatively simple replacement of defective or worn components. For example, the sealing elements arranged on the side of the valve disks 23a-23c are exposed to material stresses with each adjustment into or out of the closed position and must therefore be replaced or renewed in regular cycles. Due to the advantageous modular design, significant time savings can be realized for this maintenance activity compared to conventional valve solutions.

Figure 4A:
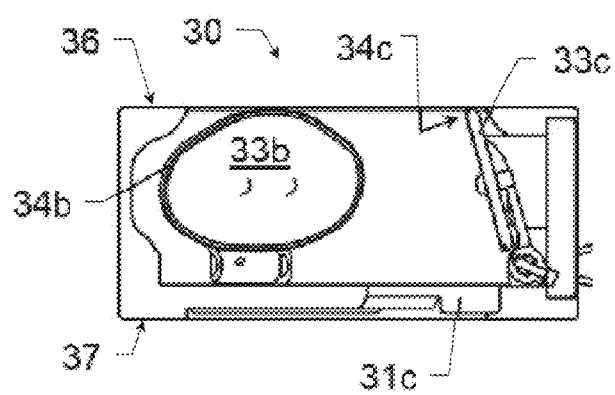
Figure 4B:
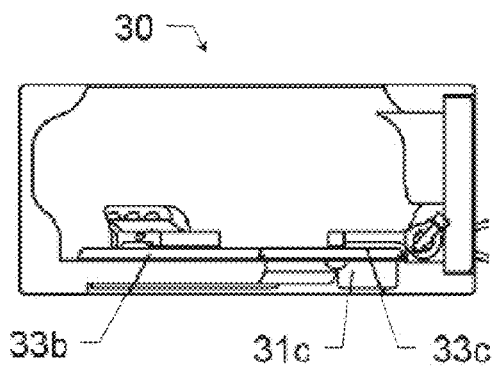
Figure 5A:
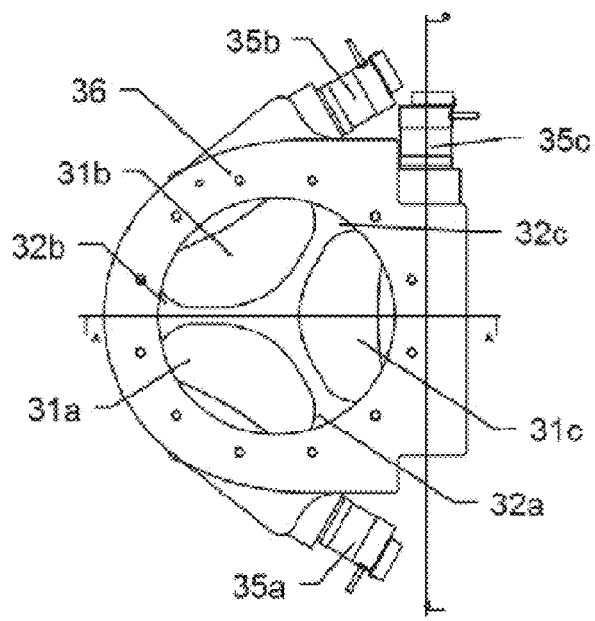
Figure 5B:
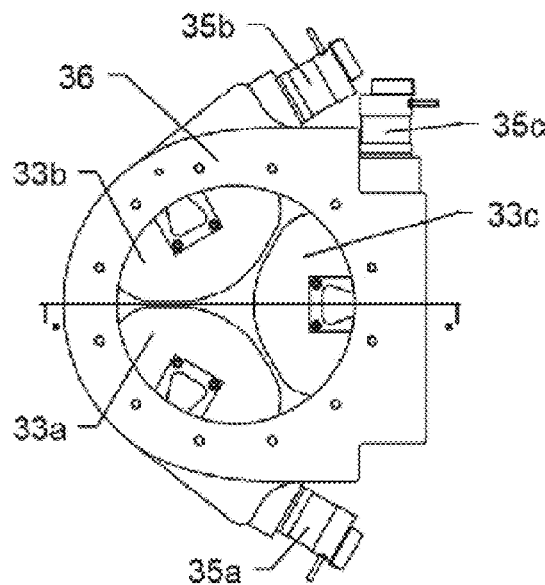

FIGS. 4a, 4b and 5a, 5b show a third embodiment of a regulating vacuum valve 30 according to the invention in cross-section and in a plan view. FIGS. 4a and 5a show the valve 30 in an open position, while FIGS. 4b and 5b show it in a closed position.

This embodiment again comprises three valve seats with respective circumferential sealing surfaces 32a-32c and respective valve partial openings 31a-31c. The valve seats or sealing surfaces 32a-32c are arranged in a common plane here. The valve partial openings 31a-31c each have the same shapes and dimensions, but are each rotated by 120° relative to the adjacent opening.

The regulating vacuum valve 30 also has three valve closures 33a-33c (valve disks) with contact surfaces 34a-34c, the sealing elements of which interact in a sealing manner with the sealing surfaces 32a-32c of the valve seats in the closed position.

Each of the valve closures 33a-33c is mounted for rotation about a respective axis of rotation. In addition, each of the valve closures 33a-33c is coupled to a respective drive component 35a-35c (motor), By means of the motors 35a-35c, the valve disks 33a-33c are rotatable about the axes of rotation in a controlled manner. The valve disks 33a-33c thus act as flaps. A surface defined by the closure side of the respective flap and a sealing plane defined by the extension of the respective sealing surface enclose a variable opening angle α in this case, with a respective opening cross-section of a valve partial opening correlating with the respective opening angle α.

Each of the motors 35a-35c is individually controllable. The regulating vacuum valve 30 also has a control or regulating unit that interacts with the motors and is designed in such a way that the motors can optionally be controlled individually or the adjustment of the flaps 33a-33c can be performed synchronously by means of corresponding control. For this purpose, the control or regulation unit has corresponding algorithms and functionalities. The flaps 33a-33c can therefore be moved simultaneously and synchronously so that, for example, when they are moved to the closed position, they provide this closed position simultaneously.

One advantage of the rotatable bearing of the valve closures 33a-33c is to provide high-precision fine regulating functionality. In contrast to a linear valve disk movement, the folding of the closures 33a-33c enables a very fine adjustment of the opening state of the valve, especially at very low pressures, by means of very small opening state change steps, which are given due to an increasing distance of the flap to the valve seat with increasing distance from the axis of rotation (at the given opening angle α>0).

The problem of a possible snap shut at very small opening angles, which often exists with valves of the prior art, is avoided with the proposed solution by providing several valve disks and the resulting lower lever forces per valve disk.

Figure 6:
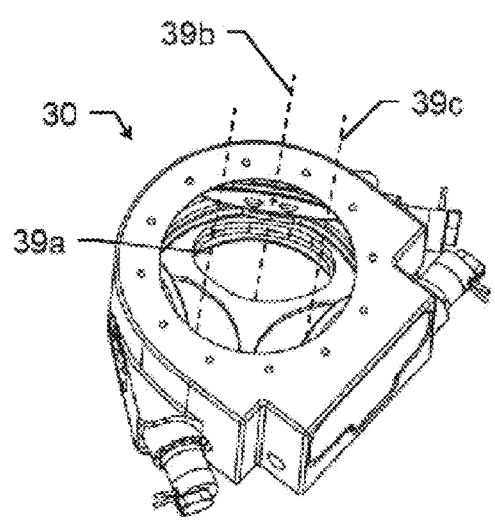
FIG. 6 shows the third embodiment of a regulating vacuum valve according to the invention in perspective.

The regulating vacuum valve 30 further comprises a first port 36 and a second port 37. At least one of the ports may be formed as a flange. The valve seats are arranged in the flow path of a flow chamber connecting the first port 36 and the second port 37, FIG. 6 shows the regulating vacuum valve 30 according to FIGS. 4 and 5 in a perspective view. The valve seats are designed such that the valve partial openings 31a-31c defined thereby define respective opening axes 39a-39c which are aligned parallel to each other. The opening axes 39a-39c intersect the respective centers of the valve partial openings 31a-31c and extend orthogonally to a sealing plane defined by the sealing surfaces 32a-32c.

The division of the overall valve opening into a plurality of partial openings also offers the advantage that a plurality of valve closures is provided and thus the mass of each individual closure can be reduced individually. Due to the lower masses to be moved, significantly shorter adjustment times can be realized, i.e. the time required to move one or all of the valve closures from an open position to a closed position (or vice versa) can be shortened.

Figure 7:
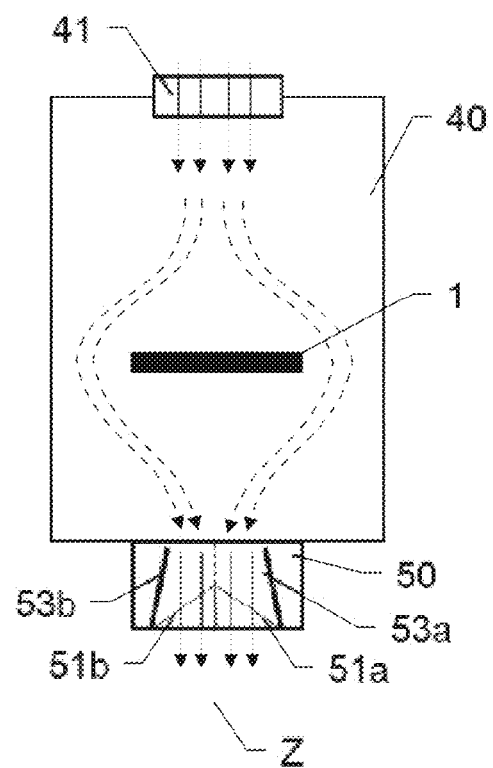
FIG. 7 shows a further embodiment of a regulating vacuum valve according to the invention connected to a process chamber.

FIG. 7 shows a process chamber 40 with a gas inlet 41 and a substrate 1 which is to be processed and is arranged in the process chamber 40.

On a side of the process chamber 40 opposite the gas inlet 41, a regulating vacuum valve 50 according to the invention which is connected to a gas outlet is provided according to a further embodiment with two valve partial openings 51a, 51b. Each valve opening is provided by a respective valve seat of the vacuum valve 50. A valve closure 53a, 53b is associated with each valve partial opening 51a, 51b. The two valve closures 53a, 53b of the valve 50 are each designed to be hinged about a respective axis of rotation. By adjusting the flaps 53a and 53b, an opening angle and thus a flow rate per time can be varied and set.

A flow of fluid through the process chamber is shown by the arrows. The specific design of the regulating vacuum valve 50 with the provision of the multiple valve partial openings 51a and 51b provides symmetrical flow of the fluid through the valve 50. Furthermore, by providing a symmetrically configured overall opening about a central valve axis Z, formed by the multiple partial openings, the outflow of the fluid from the process chamber 40 can also be carried out symmetrically (concentric).

For processing, the substrate 1 preferably rests on a chuck, which enables electrostatic holding of the substrate 1. The flow of the process gas can also be guided concentrically (homogeneously) around the chuck by means of the Symmetrical valve opening.

Such symmetrical, homogeneous or concentric flow behavior is very advantageous for processing substrates under vacuum or low-pressure conditions, since this results in just such a homogeneous distribution of the process gas over the substrate. As a result, e.g. deposition or etching processes can be carried out very uniformly and with high quality and reliability.

Figure 8:
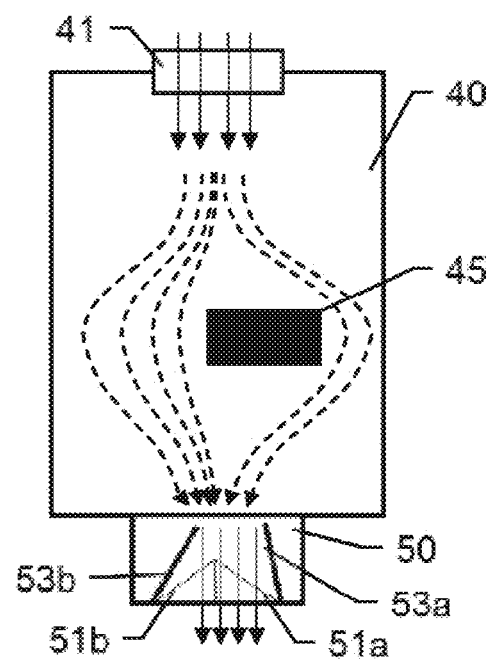
FIG. 8 shows a further embodiment of a regulating vacuum valve according to the invention connected to a process chamber with asymmetrical chamber interior structure.

FIG. 8 shows an embodiment of a process chamber 40 with a gas inlet 41 and a processing device 45 arranged in the process chamber 40 for a substrate to be processed.

On the side of the process chamber 40 opposite the gas inlet 41, there is again a regulating vacuum valve 50 according to the invention connected to a gas outlet and having two valve partial openings 51a, 51b. Each valve opening is provided by a respective valve seat of the vacuum valve 50. A valve closure 53a, 53b is associated with each valve partial opening 51a, 51b. The two valve closures 53a, 53b of the valve 50 are each designed to be hinged about a respective axis of rotation. By adjusting the flaps 53a and 53b, a respective opening angle and thus a respective flow rate per time can be individually varied and set for each of the valve partial openings 51a, 51b.

The processing device 45 is arranged asymmetrically in the process chamber 40. Such an arrangement of a processing device 45 is typical for providing the performance of generic vacuum processes. For example, the processing device 45 is attached to only one side of the chamber 40. Thus, the processing device 45 is not centrally located in the chamber 40, and this placement or attachment alone causes an asymmetrical flow of fluid through the chamber 40. As a result, fluid flows unevenly around the processing device 45.

Such an asymmetrical fluid flow through the chamber 40 can be compensated by means of the regulating vacuum valve 50 according to the invention. By providing different opening states of the individual valve partial openings 51a, 51b, the asymmetry with respect to the gas flow can be compensated. For this purpose, the valve closures 53a, 53b are set to different inclined positions (opening angle), whereby different opening cross-sections are provided in each case. The outflow of the fluid then no longer occurs centrally through the valve, but also asymmetrically within the valve with respect to the central axis.

Due to the different opening states, the fluid flow can be set to different degrees over the course of a chamber cross-section. In other words, the flow behavior of a gas can be set to different degrees in different areas of the chamber, e.g. different flow velocities can be set on opposite chamber walls.

By such variable adjustment of the fluid flow through the valve, an inhomogeneous, uneven flow behavior caused by the processing device 45 can be compensated for such that a resulting flow around the processing device 45 is symmetrical (homogeneous).

It is understood that the figures shown are only schematic illustrations of possible exemplary embodiments. According to the invention, the various approaches can also be combined with each other and with prior art methods and devices for regulating a volumetric flow or pressure in a process volume under vacuum conditions.

The invention claimed is:

1. A regulating vacuum valve configured to regulate a volumetric or mass flow and interrupt a flow path in a gas-tight manner, comprising:
   a first valve seat having a first valve opening defining a first opening axis and a first sealing surface surrounding the first valve opening;
   a first valve disk having a first contact surface corresponding to the first sealing surface; and
   a drive unit coupled to the first valve disk and configured to be adjusted at least from, an open position wherein the first valve disk and the first valve seat are in contactless relationship relative to each other, to
      a closing position wherein a gas-tight axially sealing contact exists between the first sealing surface and the first contact surface via an intermediate sealing element, and to the open position,
   wherein the regulating vacuum valve at least comprises:
      a second valve seat having a second valve opening defining a second opening axis and a second sealing surface surrounding the second valve opening; and
      a second valve disk having a second contact surface corresponding to the second sealing surface,
   wherein an overall valve opening of the regulating vacuum valve is formed by at least the first valve opening as a first valve partial opening and the second valve opening as a second valve partial opening,
   wherein the regulating vacuum valve comprises a third valve seat having a third valve opening defining a third opening axis and a third sealing surface surrounding the third valve opening, and a third valve disk having a third contact surface corresponding to the third sealing surface, wherein the overall valve opening is additionally formed by the third valve opening as a third valve partial opening, and
   wherein the first valve seat, the second valve seat and the third valve seat are inclined relative to each other and are oriented as side faces of a pyramid.

2. The regulating vacuum valve according to claim 1, wherein:
   the drive unit has at least a first drive component, a second drive component, and a third drive component, each with respective motors, and
   the first drive component is coupled to the first valve disk and the second drive component is coupled to the second valve disk, and the third drive component is coupled to the third valve disk.

3. The regulating vacuum valve according to claim 1, wherein the regulating vacuum valve has a control unit, and wherein the drive unit can be controlled based on a control signal provided by the control unit.

4. The regulating vacuum valve according to claim 3, wherein the drive unit comprises a plurality of drive components and wherein each drive component of the drive unit is individually controllable by the control signal.

5. The regulating vacuum valve according to claim 1, wherein the regulating vacuum valve has a first port and a second port, wherein the first and second valve seats are arranged in a flow channel which connects the first port and the second port to one another, and wherein the first and the second valve disks, in the open position, substantially are each fully retracted toward the first port.

6. The regulating vacuum valve according to claim 1, wherein at least one of the valve disks is configured as a flap valve closure rotatably mounted about an axis of rotation.

7. The regulating vacuum valve according to claim 6, wherein the drive unit and the at least one of the valve disks are coupled, in such a way that the at least one of the valve disks can be moved into a fine regulating position, wherein the at least one of the valve disks is inclined relative to an associated valve seat in a defined manner such that a first sealing plane and a second sealing plane enclose a defined angle x, wherein an associated sealing surface defines the first sealing plane and an associated contact surface defines the second sealing plane, and an associated sealing element is in full contact with the associated sealing surface or the associated contact surface and only partially in contact with an other associated sealing surface or associated contact surface.

8. The regulating vacuum valve according to claim 7, wherein the drive unit and the at least one of the valve disks are designed and coupled in such a way that, when the at least one of the valve disks is moved from the open position to the closed position or from the closed position to the open position, the at least one valve disk assumes the fine regulating position before reaching the closed position or before reaching the open position.

9. The regulating vacuum valve according to claim 7, wherein the first sealing surface faces in a direction parallel to the first opening axis and extends orthogonally to an associated opening axis, and the at least one of the valve disks is positioned in the fine regulating position such that the second sealing plane defined by an extension of the associated contact surface is oblique to the associated opening axis, wherein the first and the second sealing planes enclose a respective defined angle x>0° in the open position and in the fine regulating position, and the first and second sealing planes are aligned essentially parallel in the closed position.

10. The regulating vacuum valve according to claim 9, wherein a second, several or a plurality of fine regulating positions of the at least one of the valve disks are adjustable, wherein the angle x respectively enclosed by the first and second sealing planes is different in each case, and the associated sealing element is in full contact in each case with the associated sealing surface or contact surface and in only partial contact with the other associated sealing surface or contact surface, wherein a defined flow behavior through the regulating vacuum valve, can be set and/or regulated, wherein the flow behavior can be set asymmetrically with respect to a central axis (Z) of the regulating vacuum valve, wherein the central axis (Z) extends through a valve center point and forms a central axis of a flow channel.

11. The regulating vacuum valve according to claim 10, wherein the fine regulating positions can each be adjusted individually or continuously in a controlled manner to provide continuous control of the volumetric or mass flow of a medium.

12. The regulating vacuum valve according to claim 1, wherein at least one of the valve disks is linearly adjustable along an adjustment axis.

13. The regulating vacuum valve according to claim 1, wherein the first and the second valve partial openings, and the third valve partial opening, are arranged symmetrically about a central axis (Z) of the regulating vacuum valve, wherein the central axis (Z) extends through a valve center point, forming a central axis of a flow channel.

14. The regulating vacuum valve according to claim 1, wherein the first valve seat and the second valve seat are inclined at an acute angle relative to each other.

* * * * *